(12) United States Patent
Hshieh et al.

(10) Patent No.: US 6,630,402 B2
(45) Date of Patent: Oct. 7, 2003

(54) INTEGRATED CIRCUIT RESISTANT TO THE FORMATION OF CRACKS IN A PASSIVATION LAYER

(75) Inventors: Fwu-Iuan Hshieh, Saratoga, CA (US); Koon Chong So, Fremont, CA (US); John E. Amato, Tracy, CA (US)

(73) Assignee: General Semiconductor, Inc., Melville, NY (US)

( * ) Notice: Subject to any disclaimer, the term of this patent is extended or adjusted under 35 U.S.C. 154(b) by 74 days.

(21) Appl. No.: 09/990,460

(22) Filed: Nov. 21, 2001

(65) Prior Publication Data

US 2003/0096461 A1 May 22, 2003

(51) Int. Cl.[7] .............................................. H01L 21/00
(52) U.S. Cl. ........................... 438/692; 216/38; 216/75; 216/78; 216/88; 438/720; 438/745; 438/754
(58) Field of Search ................................. 438/691, 692, 438/720, 742, 745, 754; 216/38, 88, 89, 67, 75, 78, 91, 100, 105

(56) References Cited

U.S. PATENT DOCUMENTS

| | | | |
|---|---|---|---|
| 4,352,724 A | 10/1982 | Sugishima et al. | 204/192.37 |
| 4,425,183 A | 1/1984 | Maheras et al. | 438/754 |
| 4,780,429 A | 10/1988 | Roche et al. | 438/237 |
| 5,072,266 A | 12/1991 | Bulucea et al. | 257/330 |
| 5,416,048 A | 5/1995 | Blalock et al. | 438/695 |
| 5,541,425 A | 7/1996 | Nishihara | 257/139 |
| 5,583,381 A | 12/1996 | Hara et al. | 257/775 |
| 5,866,931 A | 2/1999 | Bulucea et al. | 257/331 |
| 6,077,789 A | 6/2000 | Huang | 438/720 |
| 6,121,149 A | 9/2000 | Lukanc et al. | |
| 6,208,008 B1 | 3/2001 | Arndt et al. | 257/510 |

*Primary Examiner*—William A. Powell
(74) *Attorney, Agent, or Firm*—Mayer Fortkort & Williams, PC; David D. Bonham, Esq.

(57) ABSTRACT

In integrated circuits produced by etching and damascene techniques, it is common for cracking to occur in dielectric material surrounding an interconnect metal layer integrated into the device, presumably as a result of the transfer of stresses from the interconnect metal layer to the surrounding dielectric material. The present invention addresses this problem by providing an interconnect metal layer that comprises rounded corners which are believed to reduce the stresses transferred to a surrounding dielectric layer.

18 Claims, 3 Drawing Sheets

INTEGRATED CIRCUIT RESISTANT TO THE FORMATION OF CRACKS IN A PASSIVATION LAYER

FIELD OF THE INVENTION

This invention relates to semiconductors, and more particularly to integrated circuits that are resistant to the formation of cracks in a passivation layer formed over an interconnect metal layer by producing an interconnect metal layer having a configuration with rounded corners that are believed to reduce the stress transferred to the passivation layer ultimately formed thereon.

BACKGROUND OF THE INVENTION

In semiconductor fabrication, an integrated circuit (IC) device is formed over a semiconductor substrate. The IC device usually includes, for example, transistors and/or capacitors, which are interconnected by an interconnect metal layer. After the structure of the IC device is formed, a passivation layer is then formed over the IC structure so as to protect the IC device from external damage. In order to effectively protect the IC structure, the passivation layer must be uniformly deposited, have no voids and sufficient hardness, and be able to resist cracking, penetration of water vapor or alkaline ions, and mechanical damage.

Some common materials for forming the passivation layer include silicon nitride and phosphosilicate glass (PSG). Silicon nitride has a high density and good hardness characteristics such that it can effectively resist the penetration of water vapor or alkaline ions and resist mechanical damage. PSG includes phosphoric atoms, which have a gettering property so that the water vapor and alkaline ions are effectively absorbed by it. The effectiveness of these protections prolongs the life of IC devices protected with passivation layers.

Conventional metal patterning methods, including reactive ion etching (RIE) and damascene techniques, employ anisotropic etching processes which can produce features with dimensions that are on the order of half a micron in size or less. In practice, however, anisotropic etching typically results in the creation of sharp corners in the metallized features so formed, which tend to cause high stresses in surrounding dielectric layers. In particular, these high stresses have been found to cause cracks in an overlying passivation layer. These high stresses have also been found to cause "cratering" in the fuses which are formed on integrated circuits for various purposes.

In an effort to reduce stress-induced cracking, increasing the thickness of a protective passivation layer has been suggested. However, the beneficial effects of this suggestion are limited by a corresponding increase in the brittleness of a thicker layer.

U.S. Pat. Nos. 5,416,048, 4,425,183 and 4,352,724 each suggest rounding of top corners, as seen from a sectional view, of an interconnect layer to achieve various improvements in the etching of semiconductors. In U.S. Pat. Nos. 5,416,048 and 4,425,183, and as is further disclosed in U.S. Pat. No. 4,780,429, etched metallized features can further be provided with sloping sides to achieve various other improvements. The sloping sides resulting from such manufacturing processes are composed of oxides of the metals that form the metallized features of the IC, and they have been found to yield moderately high leakage currents, which can lead to undesirable short circuiting between adjacent metallized features.

U.S. Pat. No. 6,208,008 further suggests rounding the bottom corners of an etched metal structure, as seen from a sectional view of the metal layer. The methodology disclosed in this patent, however, requires several steps and results only in producing rounded bottom corners of the resulting etched metal structure.

SUMMARY OF THE INVENTION

Accordingly, to solve the above and other difficulties, the present invention is directed towards reducing the potential for cracking of a protective passivation layer utilized in an integrated circuit. In particular, the present invention reduces cracking in an overlying passivation layer by providing an interconnect layout that comprises rounded corners, as seen from a plan view of the metal layer.

Without wishing to be bound by theory, when a passivation layer is formed on or around an interconnect layer possessing such curvilinear corner geometry, it is believed that the stresses transferred to the passivation layer are significantly reduced, thereby reducing the potential for cracking of the passivation layer commonly experienced in prior art devices.

According to a first embodiment of the present invention, a method for improving the integrity of a passivation layer within an integrated circuit is provided. The method comprises: (1) identifying an integrated circuit comprising; (a) a substrate, (b) a patterned interconnect layer having at least one corner portion formed over the substrate, and (c) a passivation layer formed over at least one of the corner portions of the interconnect layer, the passivation layer exhibiting cracking at a position over at least one of the corner portions; and (2) modifying a patterned masking layer that is used in the formation of the patterned interconnect layer, such that the one or more corner portions under the passivation layer where cracking is exhibited are substituted with one or more curvilinear corner portions. Preferably, the integrated circuit is formed by a process comprising: (1) providing a metal layer over the substrate; (2) providing the patterned masking layer over the metal layer; (3) etching the metal layer through apertures in the patterned masking layer (preferably by an anisotropic etching process), thereby producing the interconnect layer; and (4) forming the passivation layer.

According to another embodiment of the invention, a method of improving the integrity of a passivation layer within an integrated circuit is provided, which comprises: (1) identifying an integrated circuit comprising; (a) a substrate, (b) a patterned interconnect layer disposed in a damascene trench formed in the substrate, the interconnect layer having at least one corner portion, and (c) a passivation layer formed over at least one of the corner portions of the interconnect layer, the passivation layer exhibiting cracking at a position over at least one of the corner portions; and (2) modifying a patterned masking layer used to form the damascene trench such that one or more of the corner portions under the passivation layer where the cracking is exhibited are substituted with one or more curvilinear corner portions. Preferably, the integrated circuit is formed by a process comprising: (1) providing the patterned masking layer over the substrate; (2) etching the substrate through apertures in the patterned masking layer, thereby producing the damascene trench; (3) forming the interconnect layer within the damascene trench; and (4) forming the passivation layer.

An advantage of the present invention is that it permits the manufacture of IC's having enhanced life expectancy and increased resistance to short-circuiting.

The above and other embodiments and advantages of the present invention will become immediately apparent to those of ordinary skill in the art upon review of the Detailed Description and Claims to follow.

DETAILED DESCRIPTION OF THE PREFERRED EMBODIMENTS

The present invention now will be described more fully hereinafter with reference to the accompanying drawings, in which preferred embodiments of the present invention are shown. This invention may, however, be embodied in different forms and should not be construed as limited to the embodiments set forth herein.

The various embodiments of the present invention include inter alia a method of creating, and a device comprising, a metal layer over or within a substrate which has structural features that are believed to minimize the transfer of stresses to an overlying passivation layer. In particular, the present invention provides a device and method by which a metal layer having a geometry that includes rounded corners can be formed over or within a substrate.

Figure 1:
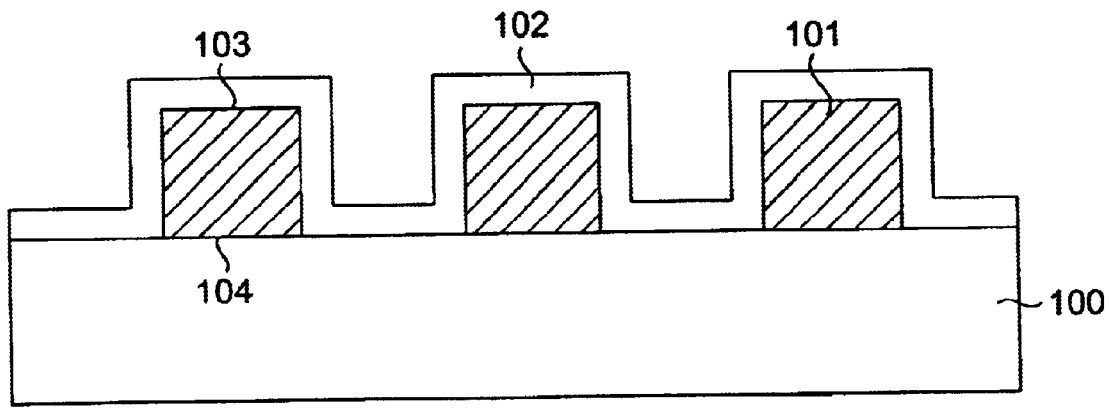
FIG. 1 is a schematic depicting a cross-sectional view of an integrated circuit having features produced using known reactive ion etching techniques.

FIG. 1 depicts a schematic of a cross-section of a conventional passivated integrated circuit. The circuit is comprised of a substrate 100 having RIE-etched metallized features 101 over its surface. The metallized features 101 each have a top portion 103, and a bottom portion 104. Overlying the metallized features 101 is a protective passivation layer 102. The protective passivation layer 102 is of suitable material such as silicon nitride or phosphosilicate glass (PSG), and more preferably phosphosilicate glass.

The actual configuration of the substrate 100 in FIG. 1 (or the substrate in FIG. 2 below) will depend upon the integrated circuit that is selected. As a specific example, the integrated circuit can comprise one or more trench MOSFET devices. As is known in the art, these devices can include, for example, (a) a semiconductor wafer of a first conductivity type, typically n-type conductivity silicon; (b) an epitaxial layer of the first conductivity type over the substrate; (c) a trench extending into the epitaxial layer; (d) an insulating layer, typically silicon dioxide, lining at least a portion of the trench; (e) a conductive region, typically doped polysilicon, within the trench adjacent the insulating layer; (f) a body region of a second conductivity type formed within an upper portion of the epitaxial layer and adjacent the trench; (g) a source region of the first conductivity type formed within an upper portion of the body region and adjacent the trench, and (h) an insulating regionl, typically borophosphosilicate glass (BPSG) formed over a portion of the conductive region. An interconnect layer that includes both gate metal and source metal portions is provided over this structure (hence, this structure acts as an interconnect layer substrate). Examples of trench MOSFET transistors are disclosed, for example, in U.S. Pat. Nos. 5,072,266, 5,541,425, and 5,866,931, the disclosures of which are hereby incorporated by reference.

Figure 2:
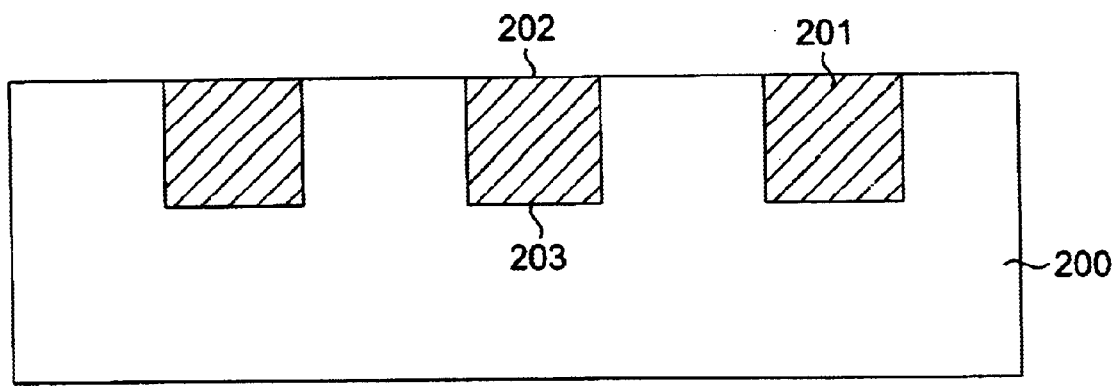
FIG. 2 is a schematic depicting a cross-sectional of an integrated circuit having features produced by known damascene etching techniques.

Referring now to FIG. 2, depicted therein is a schematic of a conventional integrated circuit produced by a damascene process. In this circuit, trenches in a substrate 200 are filled with metal and polished (e.g., by chemical mechanical polishing) to form an interconnect layer 201 embedded in the substrate 200. The interconnect layer 201 has top portions 202, and bottom portions 203.

Figure 3:
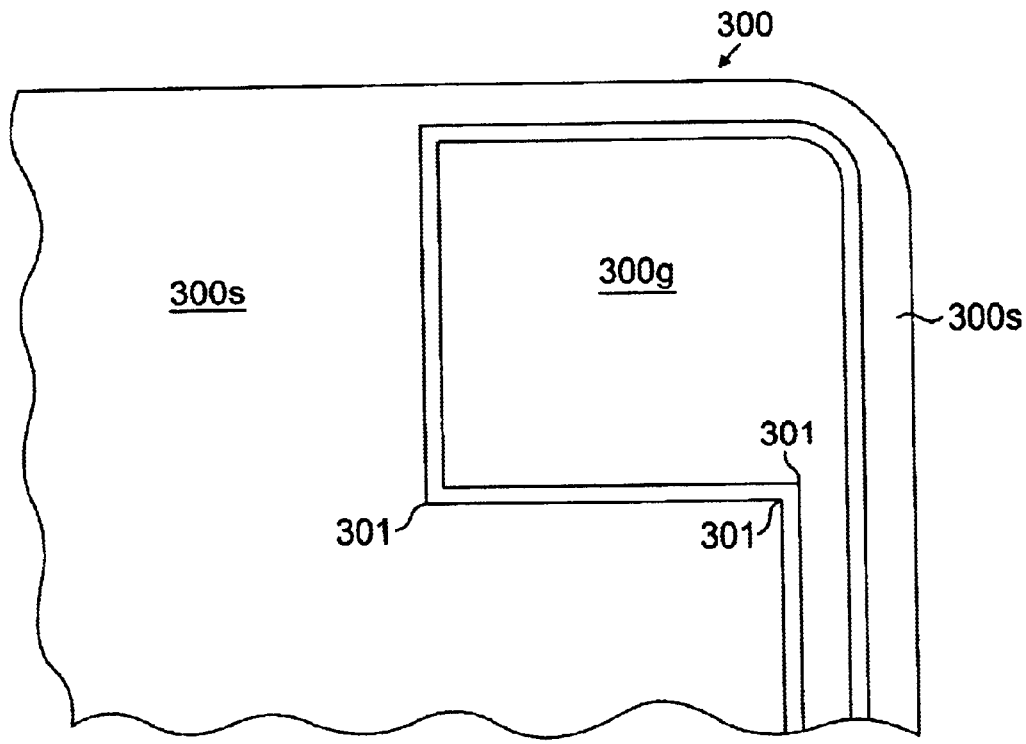
FIG. 3 is a schematic depicting a plan view of a metallic interconnect produced by known etching techniques.

FIG. 3 is one example of a circuit in which an interconnect geometry having sharp corners is provided. FIG. 3 is a plan-view schematic of a portion of an interconnect layer associated with a trench MOSFET. As depicted therein, interconnect layer 300 layout includes a gate metal portion 300g and a source metal portion 300s which comprises at least one sharp corner 301 (three are numbered).

When interconnect layer 300 is overlain with a passivation layer like layer 102 of FIG. 1, it is common for cracking or delayering of the passivation layer to occur, particularly at corners with a sharp concavity in plan view such as the concave corners 301 of FIG. 3 (e.g., the right-hand-most labeled corner has proven to be particularly problematic in this illustrated circuit design). It is theorized that such sharp concave corners in an interconnect layer underlying a passivation layer produce unduly large stress concentrations which, when transferred to the passivation layer above, cause undesirable cracking and potential current leakage.

Figure 4:
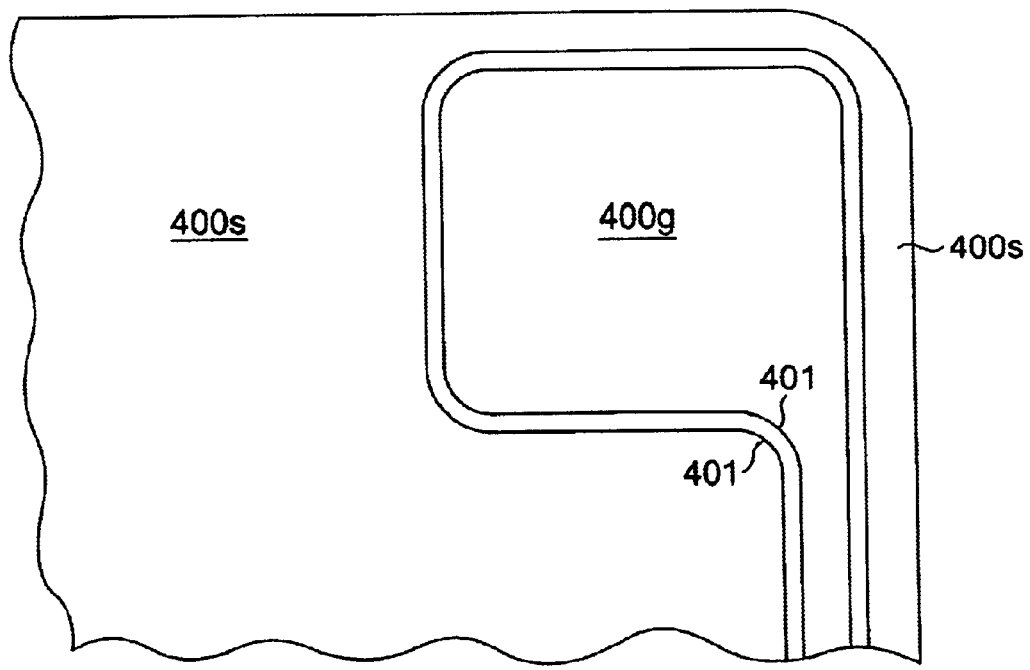
FIG. 4 is a schematic depicting a plan view of a metallic interconnect produced in accordance with the present invention.

The method of the present invention addresses the issue of the transfer of stress from the interconnect layer 101 of FIG. 1 to the protective passivation layer 102 by providing an interconnect layer with rounded corners in plan view as depicted in FIG. 4.

As shown in FIG. 4, an interconnect layer 400 formed in accordance with the present invention comprises rounded corner portions 401 instead of the sharp corners of conventional interconnect layers such as corners 301 of FIG. 3. The curvilinear nature of the rounded corners 401 is believed to transfer significantly less stress to an overlying or surrounding layer by virtue of the corner geometry, thereby providing enhanced circuit integrity, reliability and life expectancy. Preferably, the radius of curvature of the corners in the interconnect layer 400 is less than 20 microns, more preferably, from 1 to 20 microns, even more preferably between 5 and 10 microns, and most preferably between 7 microns and 10 microns.

Hence, although interconnect layers with passivation-layer-covered curvilinear features are known, it is not known to replace sharp corners (in plan view) of an interconnect layer with rounded corners to prevent cracking of the passivation layer as is done in connection with the present invention.

Figure 5:
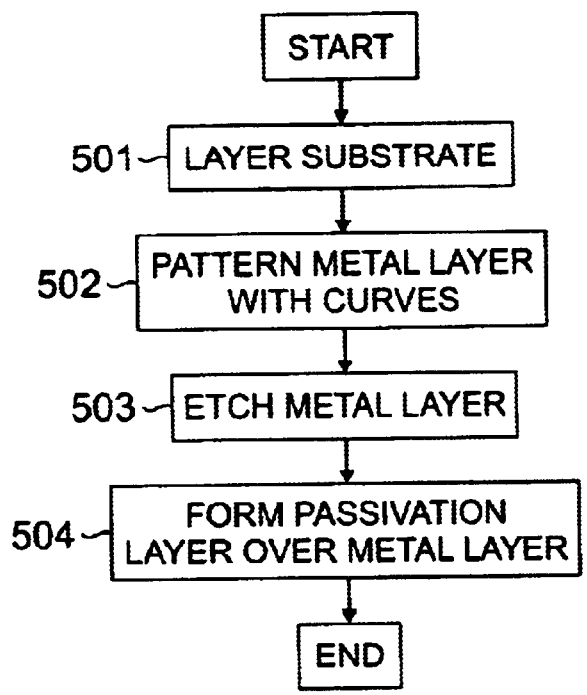
FIG. 5 is a flow chart depicting a method in accordance with a first embodiment of the present invention.

The methodology of the present invention is applicable to both metal etch and damascene processing techniques and various circuit topologies. With respect to metal etch processing, and according to a first embodiment of the invention, the circuit topology shown in FIG. 1 can be achieved in accordance with the method outlined in FIG. 5 by first layering a substrate with a metal layer formed of a suitable material such as aluminum. This step is depicted as step 501 in FIG. 5. The metal layer is then patterned with a desired metal interconnect mask utilizing conventional lithography techniques. To achieve the benefits of the present invention, the mask is designed with corners having curvilinear characteristics such as those discussed in conjunction with FIG. 4. This patterning step is depicted as step 502 of FIG. 5. The metal is then etched through apertures in the mask utilizing conventional etching methods to produce a substrate having an interconnect layer thereon that conforms to the patterned mask configuration as depicted by step 503 of FIG. 5. Finally, as depicted by step 504 of FIG. 5, a passivation layer is formed over at least portions of the patterned metal interconnect layer.

Figure 6:
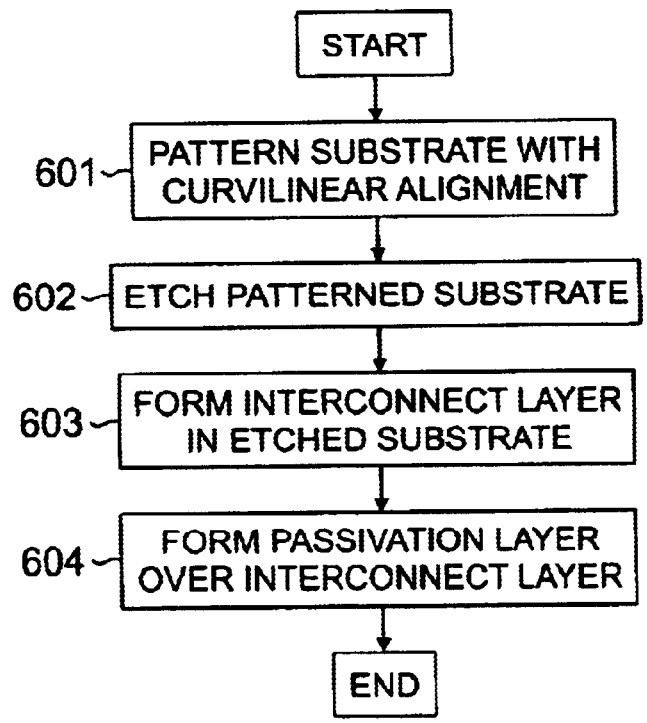
FIG. 6 is a flow chart depicting a method in accordance with a second embodiment of the present invention.

With respect to processing of an integrated circuit using damascene techniques and in accordance with a second embodiment of the present invention, the circuit topology depicted in FIG. 2 can be achieved according to the method depicted in FIG. 6. As is depicted in FIG. 6, an integrated circuit in accordance with a second embodiment of the present invention is achieved by first providing a patterned mask on s suitable substrate. To achieve the benefits of the present invention, the patterned mask is designed with corners having curvilinear alignment such as is discussed in conjunction with FIG. 4. This patterning step is depicted as step 601 of FIG. 6. The patterned substrate is then etched utilizing conventional etching methods to produce a substrate having one or more damascene trenches that conform to the patterned alignment as depicted by step 602. A metal interconnect layer is formed within the etched trench as depicted by step 603, for example by depositing metal in the one or more trenches and subsequently applying chemical mechanical polishing. Finally, a passivation layer is formed over at least portions of the metal interconnect layer as depicted in step 604.

The embodiments described above thereby provide a simple and practical way to reduce cracking in dielectrics that cover the interconnect layer of an integrated circuit.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A method of improving the integrity of a passivation layer within an integrated circuit comprising:
    identifying an integrated circuit comprising; (a) a substrate, (b) a patterned interconnect layer having at least one corner portion formed over said substrate, and (c) a passivation layer formed over at least one of said corner portions of said interconnect layer, said passivation layer exhibiting cracking at a position over at least one of said corner portions;
    modifying a patterned masking layer that is used to form said patterned interconnect layer, such that the one or more corner portions under the passivation layer where cracking is exhibited are substituted with one or more curvilinear corner portions.

2. The method according to claim 1 wherein said radius of curvature is less than 20 microns.

3. The method according to claim 1 wherein said radius of curvature ranges between 1 and 20 microns.

4. The method according to claim 1 wherein said radius of curvature ranges between 5 and 10 microns.

5. The method according to claim 1 wherein said passivation layer comprises phosphosilicate glass.

6. The method according to claim 1 wherein said interconnect layer is formed of metal.

7. The method according to claim 1, wherein said substrate comprises a plurality of trench MOSFET devices, and wherein said interconnect layer comprises a source metal region and a gate metal region.

8. The method according to claim 1, wherein at least one of the corner portions under the passivation layer where cracking is exhibited is a concave corner portion.

9. The method according to claim 1, wherein said integrated circuit is formed by a process comprising:
    providing a metal layer over said substrate;
    providing said patterned masking layer over said metal layer;
    etching said metal layer through apertures in said patterned masking layer, thereby producing said interconnect layer; and
    forming said passivation layer.

10. The method according to claim 8 wherein said etching step comprises an anisotropic etch.

11. A method of improving the integrity of a passivation layer within an integrated circuit comprising:
    identifying an integrated circuit comprising; (a) a substrate, (b) a patterned interconnect layer disposed in a damascene trench formed in said substrate, said interconnect layer having at least one corner portion, and (c) a passivation layer formed over at least one of said corner portions of said interconnect layer, said passivation layer exhibiting cracking at a position over at least one of said corner portions;
    modifying a patterned masking layer used to form said damascene trench such that one or more of the, corner portions under the passivation layer where the cracking is exhibited are substituted with one or more curvilinear corner portions.

12. The method according to claim 11 wherein said radius of curvature is less than 20 microns.

13. The method according to claim 11 wherein said radius of curvature ranges between 1 and 10 microns.

14. The method according to claim 11 wherein said radius of curvature ranges between 5 and 10 microns.

15. The method according to claim 11 wherein said passivation layer comprises phosphosilicate glass.

16. The method according to claim 11 wherein said interconnect layer is formed of metal.

17. The method according to claim 11, wherein at least one of the corner portions under the passivation layer where cracking is exhibited is a concave corner portion.

18. The method according to claim 11, wherein said integrated circuit is formed by a process comprising:
    providing said patterned masking layer over said substrate;
    etching said substrate through apertures in said patterned masking layer, thereby producing said damascene trench;
    forming said interconnect layer within said damascene trench; and
    forming said passivation layer.

* * * * *

UNITED STATES PATENT AND TRADEMARK OFFICE
CERTIFICATE OF CORRECTION

PATENT NO. : 6,630,402 B2
DATED : October 7, 2003
INVENTOR(S) : Hshieh et al.

It is certified that error appears in the above-identified patent and that said Letters Patent is hereby corrected as shown below:

Column 3,
Line 66, change "regionl" to -- region --.

Column 5,
Line 18, change "on s suitable" to -- on a suitable --.

Signed and Sealed this

Fourth Day of January, 2005

JON W. DUDAS
*Director of the United States Patent and Trademark Office*